(12) United States Patent
Murakami et al.

(10) Patent No.: US 7,746,731 B2
(45) Date of Patent: Jun. 29, 2010

(54) ELECTRONIC DEVICE WITH SOLAR CELL

(75) Inventors: Eiki Murakami, Kokubunji (JP); Takeo Mutoh, Tokyo (JP); Takayuki Hasumi, Niiza (JP); Kenji Shimoda, Tokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 873 days.

(21) Appl. No.: 11/578,195

(22) PCT Filed: Apr. 13, 2005

(86) PCT No.: PCT/JP2005/007165

§ 371 (c)(1),
(2), (4) Date: Oct. 11, 2006

(87) PCT Pub. No.: WO2005/101140

PCT Pub. Date: Oct. 27, 2005

(65) Prior Publication Data

US 2007/0240753 A1 Oct. 18, 2007

(30) Foreign Application Priority Data

Apr. 13, 2004 (JP) .............................. 2004-117937

(51) Int. Cl.
*G04B 1/00* (2006.01)
*G04C 10/00* (2006.01)
*H01L 31/042* (2006.01)
*H01L 31/00* (2006.01)

(52) U.S. Cl. ........................ 368/205; 136/244; 136/251

(58) Field of Classification Search ......... 368/203–205; 136/243, 244, 251, 259
See application file for complete search history.

(56) References Cited

U.S. PATENT DOCUMENTS

| 3,757,511 | A | * | 9/1973 | Burgess et al. ................. 368/83 |
| 3,890,776 | A | * | 6/1975 | Urushida .................... 368/205 |
| 4,165,604 | A | * | 8/1979 | Matsumura et al. ......... 368/288 |
| 4,261,049 | A | * | 4/1981 | Komiyama et al. ........... 368/88 |
| 4,296,489 | A | * | 10/1981 | Mitsui ........................ 368/205 |
| 5,912,064 | A | * | 6/1999 | Azuma et al. ................ 428/141 |
| 6,122,226 | A | * | 9/2000 | Murakami et al. ............ 368/80 |
| 6,372,977 | B1 | * | 4/2002 | Miyoshi ..................... 136/246 |
| 6,538,959 | B1 | * | 3/2003 | Yamaguchi et al. ......... 368/205 |

FOREIGN PATENT DOCUMENTS

| JP | 09-243759 | 9/1997 |
| JP | 10-082871 | 3/1998 |
| JP | 10-123265 | 5/1998 |
| JP | 2003-057366 | 2/2003 |

* cited by examiner

*Primary Examiner*—Vit W Miska
(74) *Attorney, Agent, or Firm*—Smith, Gambrell & Russell, LLP

(57) ABSTRACT

An electronic device such as a watch comprises a solar cell (14) and window portions (2, 6) which is located on the solar cell (14) and through which light is applied to the solar cell (14). The solar cell (14) is divided into a plurality of divided cells such that irradiated portions (14A to 14F) of the divided cells are equal in area, in consideration of the shapes, areas, and number of the window portions (2, 6) and the number of divisions of the solar cell (14).

15 Claims, 18 Drawing Sheets

FIG. 15
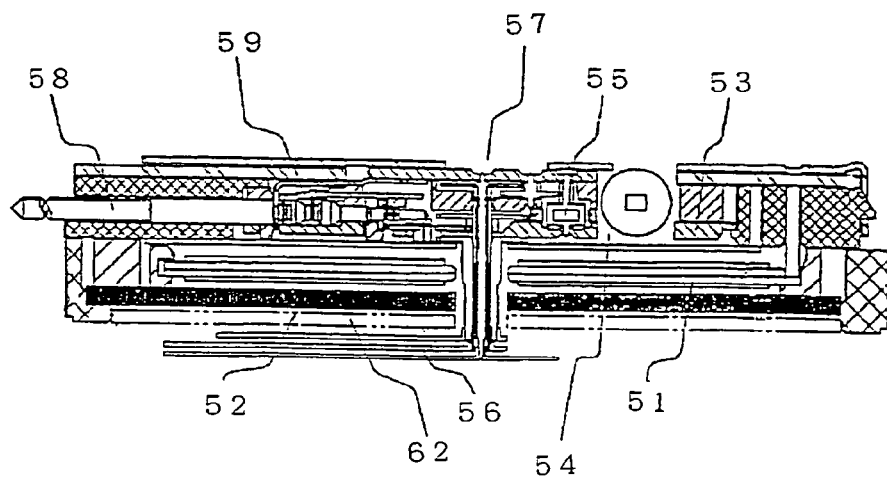
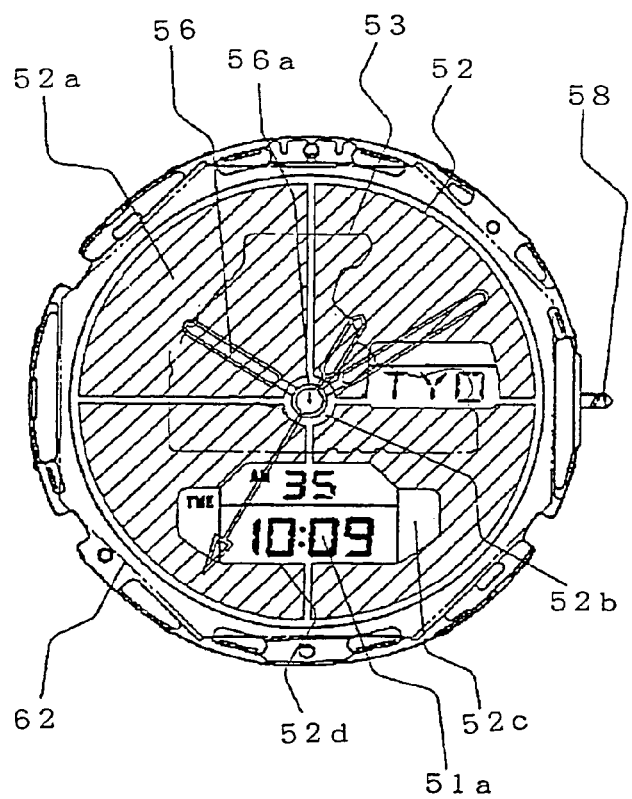
FIG. 16

ELECTRONIC DEVICE WITH SOLAR CELL

TECHNICAL FIELD

The present invention relates to a conventional electronic device with solar cell configured to be driven by electric energy converted from optical energy.

BACKGROUND ART

A conventional electronic device with solar cell, e.g., an electronic watch with solar cell, is generally constructed so that a solar cell is located on the back of a dial in order to obtain high power generation efficiency. For example, a combination watch using a solar cell is disclosed in Japanese Patent Application Laid-Open No. 10-82871. This combination watch has an analog block including a hand display, a liquid crystal cell as an electro-optical display, and a solar cell for photovoltaic power generation.

A construction of the combination watch disclosed in the aforesaid patent document will be described with reference to FIGS. 15 and 16.

The analog block, like a basic structure of a well-known three-hand-display watch, comprises a main plate 53 as a base, a step motor 54 as an electromechanical transducer, a hand display train 57 for transmitting rotation driving force from a rotor 55 that constitutes the step motor 54 to a hand 56, and an external switching mechanism 59 including a setting stem 58 for hand adjustment. A dial 62 is formed of a transparent plastic material such that digital display can be recognized from the display surface side of the watch and lest it hinder photovoltaic power generation.

A rotating shaft 56a of the hand 56 is located in the center of the watch and a power generation surface of a solar cell 52 occupies the entire display surface of the watch.

The solar cell 52 has a hole portion 52b into which the rotating shaft 56a of the hand 56 is evacuated and is divided in four by dividing lines. Since a single solar cell can produce so low a power generation voltage that it cannot fully charge a secondary cell, it is divided into a plurality of parts, which are connected in series to secure an appropriate satisfactory voltage. A window portion 52d defined by a power generation element-free portion 52c is formed in a part of a power generation surface 52a of the solar cell 52 that is based on a glass substrate, and the time of day can be displayed through a digital display 51a of a liquid crystal cell 51 that is located under the window portion 52d. A total-transmission dial 62 is located on the upper surface of the solar cell 52. It is formed of a transparent plastic material such that the digital display 51a can be recognized and lest it hinder photovoltaic power generation.

The combination watch with the configuration described above with reference to FIGS. 15 and 16 has a problem that its appearance quality is damaged because the dividing lines and a plum color proper to the solar cell can be visually recognized with ease.

In this view, a multifunction watch with an improved appearance quality has been developed using a quadruple solar cell on which a partial-transmission dial formed with window portions is located. Its outline will be described with reference to FIGS. 17 to 19.

A dial 20 is of a metallic partial-transmission type and is formed having three window portions, including a time-of-day second display window 21, a chronograph hour display window 22, and a chronograph minute display window 23, a center hole 24, which is penetrated by a hand shaft, and a calendar display window 25. A group of hands 26 for time-of-day display and a group of hands 27 for chronograph display are arranged in predetermined positions on the individual display portions.

As shown in FIG. 19, a solar cell 30 is divided into four zones A, B, C and D by dividing lines 31 in the 3-9 o' clock direction and the 6-12 o' clock direction. These four zones A to D are equal in area. In the solar cell 30 having the dial 20 placed thereon, the respective areas of irradiated portions of four divided cells divided by the window portions 21, 22 and 23 (indicated by two-dot chain lines in the drawing) through which light is applied to individual parts correspond individually to a semicircular area 30A in the zone A, a semicircular area 30B in the zone B, an equivalently circular area 30C+30C in the zone C, and an equivalently circular area 30D+30D in the zone D, as indicated by hatching. Thus, the divided cells A and B are different from the divided cells C and D in irradiated portion area.

In the chronograph watch using the partial-transmission dial described above, as compared with the one using the total-transmission dial, the areas of the irradiated portions are so narrow that the plum color proper to the solar cell is not very conspicuous through the dial. Since the dividing lines that can be peered through the individual display windows 21, 22 and 23 are crisscrossed and obscured by printed figures and the like, moreover, they cannot damage the appearance quality very much. Above all, however, the respective irradiated portions of the four divided cells are different in area, so that the value of suppliable current varies between the divided cells A and B and the divided cells C and D. If the four divided cells are connected in series with one another as they are used with unbalanced suppliable current values, therefore, the divided cells A and B of which the irradiated portions have small areas are inevitably restricted to the suppliable current values. Thus, the solar cell fails to demonstrate its original capacity, so that its power generation efficiency is poor.

DISCLOSURE OF THE INVENTION

The present invention solves the above-described drawbacks, and its object is to provide an electronic device with solar cell, e.g., a solar-cell watch, capable of ensuring high power generation efficiency despite the use of a partial-transmission dial.

In order to achieve the above object, an electronic device with solar cell according to the present invention comprises a solar cell, a window member located thereon, and a load which is driven by electric power supplied from the solar cell, wherein the solar cell has n (n: 2 or a larger integer) number of divided cells for supplying electric power to the load, the window member has a first window portion and other window portions including a second window portion having an area different from that of the first window portion, and the first window portion and the other window portions are located in the window member so that irradiated areas of the n number of divided cells are equal. Thus, although the window member has the window portions with different areas, the respective areas of the individual divided cells can be equalized to ensure efficient power generation.

In the electronic device with solar cell according to the present invention, moreover, at least one of the first and second window portions may define an irradiated region striding over two or more adjacent divided cells, and the other window portions may define irradiated regions at least in all other divided cells in which no irradiated region is defined by the first window portion.

The electronic device with solar cell may assume the following aspects.

The area of the first window portion may be set to be n1 times as large as a unit area W (n1 is an integer), the area of the second window portion may be set to be n2 times as large as the unit area W (n2 is an integer different from n1), and the first window portion and the second window portion may be arranged in the window member so that the irradiated region defined by the first window portion and the irradiated region defined by the second window portion are distributed with the unit area W to the individual divided cells. Thus, the solar cell can be simply divided without complicating the dividing lines.

The other window portions may include only the second window portion, and the number n of the divided cells is equalized to the sum of the numbers n1 and n2.

Additional irradiated regions defined by the other window portions may be added into first divided cells in which the irradiated region is defined by the first window portion. Thus, the area of the irradiated region of the first divided cells can be adjusted to be the same as the irradiated area of the other divided cells.

The area of the first window portion may be smaller than the area of the second window portion, and the additional irradiated regions may be formed in a manner such that parts of the irradiated region defined by the second window portion are distributed in the first divided cells. Thus, the area of the first divided cells can be adjusted by the second window portion. The irradiated area of the first divided cells may be equalized to the irradiated area of second divided cells in which the irradiated regions are formed of remaining parts other than the parts of the irradiated region defined by the second window portion. Thus, the irradiated regions of the first window portion and the second window portion can be equally divided into the divided cells. The additional irradiated region may be defined by a third window portion provided independently of the first and second window portions in the dial. Thus, the difference between the respective irradiated areas of the first and second divided cells based on the difference between the respective areas of the first window portion and the second window portion can be adjusted without changing the areas of the first and second window portions. The irradiated area of the first divided cells may be equalized to the irradiated area of second divided cells in which the irradiated regions are defined by the second window portion. Thus, the irradiated regions of the divided cells can be equalized by the first window portion and the second window portion only.

The other window portions may include window portions other than the second window portion, the window portions formed in the window member may be divided into a first group including the first window portion and a second group including the second window portion so that at least one of the window portions are formed of a plurality of window portions, the respective areas of the window portions are set so that a total area of the irradiated region defined by the window portions of the first group and a total area of the irradiated region defined by the window portions of the second group are equal, and the window portions are arranged so that the irradiated region defined by the window portions of the first group and the irradiated region defined by the window portions of the second group are divided forming irradiated regions of areas equal to those of the divided cells. Thus, the divided cells can be formed having simple, equal irradiated regions despite the presence of the window portions with different areas.

The individual divided cells may be all equalized in area. Thus, the respective areas of the divided cells are equal even when the solar cell is used in a total-transmission or half-transmission dial.

The individual irradiated regions defined by the first window portion and the other window portions may be internally divided by dividing lines extending in the same direction or at right angles to each other, and the other region than the irradiated regions is divided by using straight lines other than the dividing lines extending at right angles or curved dividing lines. Thus, the dividing lines in a range such that they can be visually recognized from outside the solar cell can be made obscure, and the solar cell can be freely divided by the dividing lines in an invisible range.

In the electronic device of the present invention, the respective areas of the irradiated regions of the individual divided cells are set to be substantially equal, so that its power generation efficiency is satisfactory.

BRIEF DESCRIPTION OF THE DRAWINGS

FIG. 15 is a sectional view of a conventional combination watch using a solar cell;

FIG. 16 is a plan view of the watch of FIG. 15;

BEST MODE FOR CARRYING OUT THE INVENTION

Figure 1:
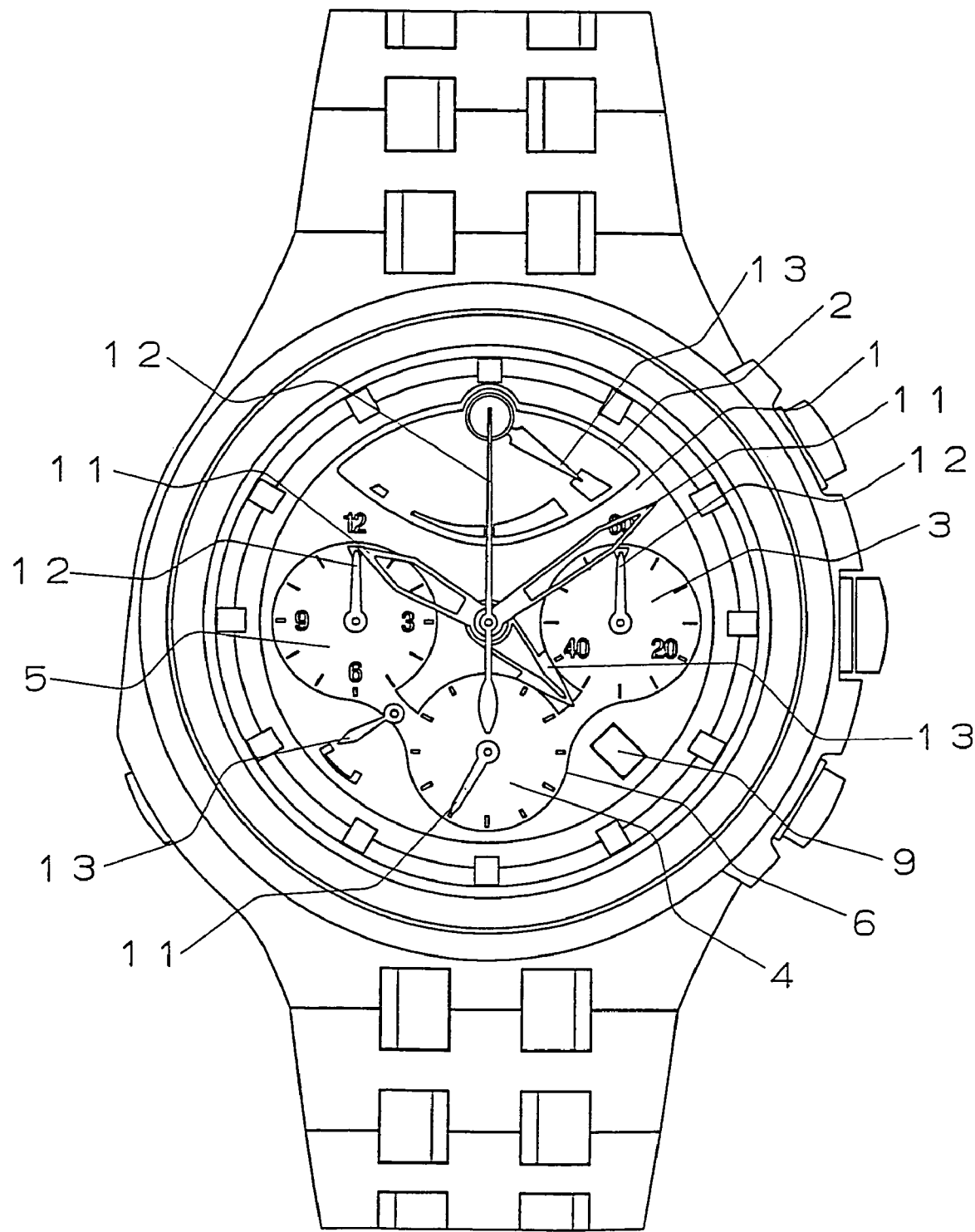
FIG. 1 is a plan view showing an external appearance of an electronic device (electronic watch) with solar cell according to a first embodiment of the present invention.

In an electronic device such as a chronograph watch with solar cell, loads are driven by electric power that is supplied from a solar cell. These loads include, for example, an oscillator circuit that outputs a high-frequency signal using a quartz resonator, a divider circuit for dividing the frequency of the high-frequency signal outputted from the oscillator circuit into signals of one-second period, and a driver circuit for converting the signals outputted from the divider circuit into driving signals for driving a step motor. The loads further include a drive control circuit that controls the operation of the driver circuit in response to the operation of a control button, a charge control circuit for preventing overcharge of a secondary cell and controlling charge warning and the like, etc.

Referring first to FIGS. 1 to 6, there will be described a first embodiment of an electronic device (multifunction watch) with chronograph function according to the present invention.

A first dial 1, which is made of a metallic partial-transmission dial, is formed having a charged capacity display window 2 (first window portion) in a 12-o' clock position, a chronograph minute display window 3 in a 3-o' clock position, a time-of-day second display window 4 in a 6-o' clock position, and a chronograph hour display window 5 in a 9-o' clock position. The chronograph minute display window 3, time-of-day second display window 4, and chronograph hour display window 5 communicate with one another and constitute a second window portion 6, another window portion. Specifically, hands located in the 12-o' clock position, 3-o' clock position, 6-o' clock position, and 9-o' clock position rotate or rock in the regions of the first and second window portions, thereby displaying predetermined information. The area of the second window portion is twice that of the first window portion, and the sum of the respective areas of the first and second window portions is set to be not smaller than a necessary minimum area for charging the secondary cell (not shown).

Further, the first dial 1 is formed with a center hole 8, which is penetrated by a hand shaft 7, and a calendar display window 9.

Under the first dial 1, a second dial (plastic dial) 10 (see FIG. 5) formed of a translucent member with a light transmittance α defined by 1>α>0 is located between the first dial 1 and the solar cell, which will be mentioned later. The transmittance α is set within a range such that dividing lines of the solar cell and the color tone of the solar cell cannot be visually recognized with ease and that it never falls below the electric power that drives the loads.

Figure 2:
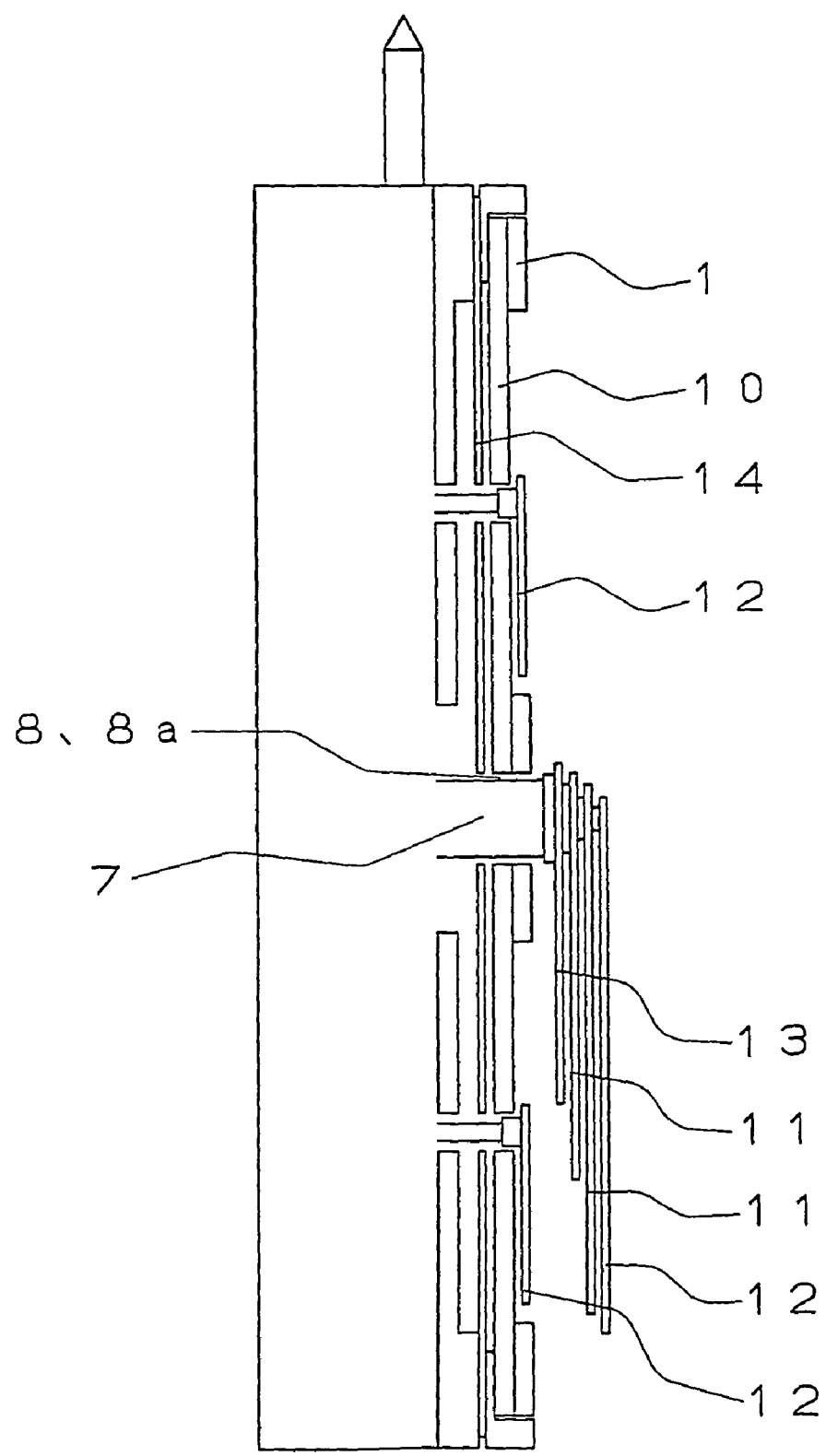
FIG. 2 is a sectional view showing a principal part of the watch of FIG. 1.

The second dial 10 is formed with a center hole 8a, which is penetrated by a hand shaft 7, and a calendar display window 9a. The first dial 1 and the second dial 10 are laminated together to form a completed dial shown in FIG. 3. As shown in FIGS. 1 and 2, a group of hands 11 for time-of-day display, a group of hands 12 for chronograph display, and a group of other hands 13 are arranged individually on the display portions.

Figure 6:
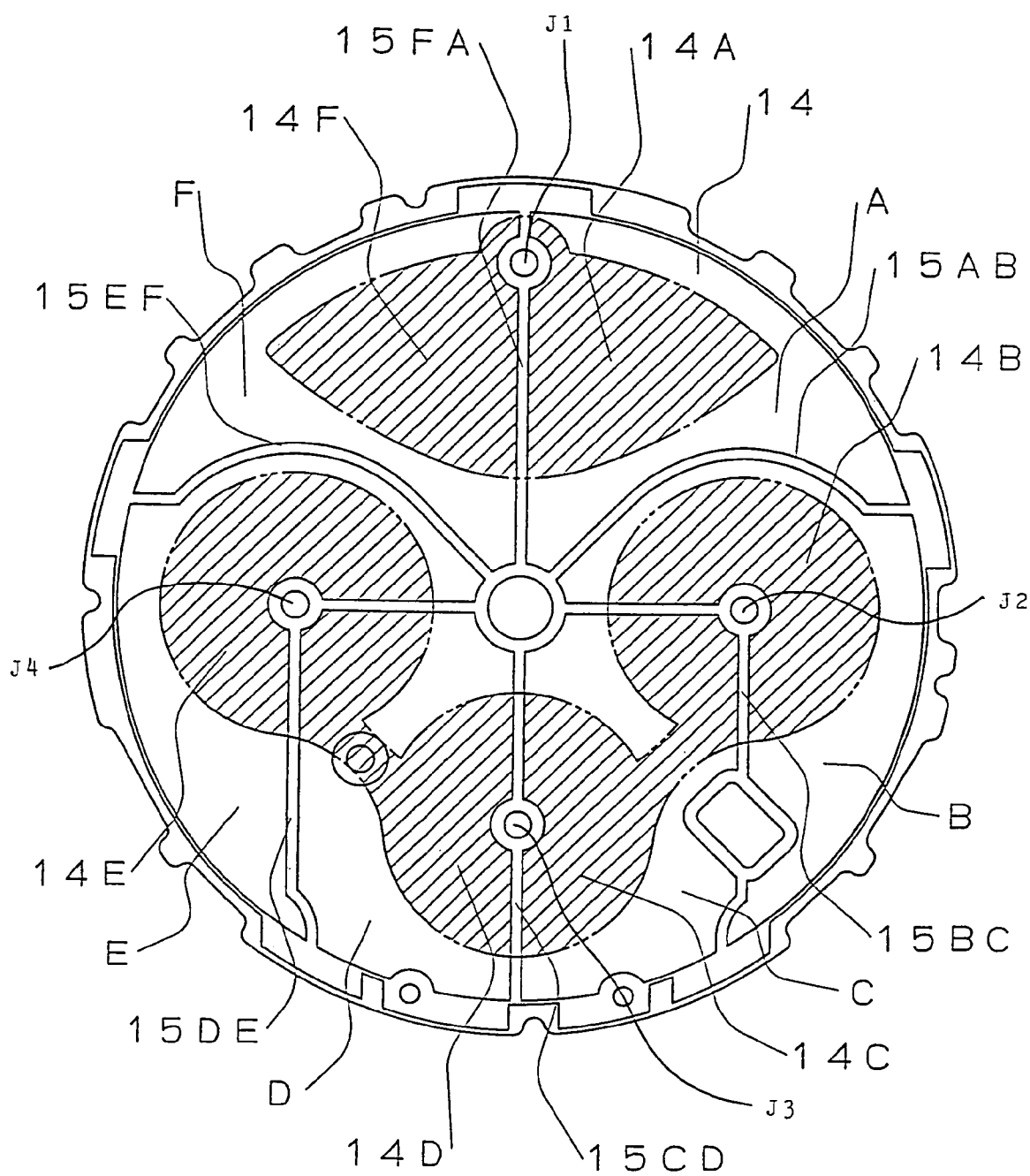
FIG. 6 is a plan view of a solar cell used in the watch of FIG. 1.

As shown in FIG. 6, a solar cell 14 is divided into six zones (divided cells) A, B, C, D, E and F with the same area by dividing lines 15FA, 15AB, 15BC, 15CD, 15DE and 15EF.

If light is applied from above to the completed dial that is formed of the first dial 1 and the second dial 10 and placed on the solar cell 14, the light is transmitted through the first and second window portions 2 and 6 and lands on hatched regions 14A to 14F inside two-dot chain lines on the divided cells A to F shown in FIG. 6. The respective areas of the first and second window portions 2 and 6 of the first dial 1 and the dividing lines 15FA to 15EF are individually set so that the irradiated regions 14A to 14F of the divided cells A to F are equal in area. The other part of the first dial 1 (FIG. 4) than the first and second window portions 2 and 6 forms a light shielding portion.

In the first dial 1, an area W1 of the first window portion 2 and an area W2 of the second window portion 6 are individually set so that an area W1/2 of each half of the first window portion 2 and an area W2/4 of each quarter of the second window portion 6 are equal (W1/2=W2/4).

In the solar cell 14, as shown in FIG. 6, an irradiated region defined by the first window portion 2 is halved by the dividing line 15FA and divided between the irradiated region 14A of the divided cell A and the irradiated region 14F of the divided cell F. Further, an irradiated region defined by the second window portion 6 is quartered by the dividing lines 15BC, 15CD and 15DE and divided into the irradiated region 14B of the divided cell B, the irradiated region 14C of the divided cell C, the irradiated region 14D of the divided cell D, and the irradiated region 14E of the divided cell E.

Thus, the divided cells A, B, C, D, E and F of the solar cell 14 are given the irradiated regions 14A, 14B, 14C, 14D, 14E and 14F that have the same area (W1/2=W2/4).

If a dial is formed with a first window portion with an area (n1×W) that is n1 times as large as a unit area W, a second window portion with an area (n2×W) that is n2 times as large as the unit area W, . . . , and a k' th window portion with an area (nk×W) that is nk times as large as the unit area W (n1, n2, . . . , and nk are integers not smaller than 1), in general, irradiated regions having the same area (=W) can be given individually to (n1+n2+ . . . +nk) number of divided cells by setting a plurality of dividing lines such that an irradiated region defined by the first window portion on the solar cell is divided into n1 number of equal parts, an irradiated region defined by the second window portion is divided into n2 number of equal parts, . . . , and an irradiated region defined by the k' th window portion is divided into nk number of equal parts.

In other words, the irradiated region defined by the first window portion is n1 times as large as the unit area W, and the irradiated region defined by the second window portion is n2 times as large as the unit area W. The solar cell is divided into (n1+n2) number of divided cells, and irradiated regions with the unit area W are distributed individually to the divided cells.

The divided cells A and F of which the irradiated regions are defined by the first window portion are first divided cells, while the divided cells B to E of which the irradiated regions are defined by the second window portion are second divided cells.

In the solar cell 14, the divided cells A to F are equal in area, and the irradiated regions 14A to 14F of the divided cells A to F are also equal in area. This implies that the respective areas of non-irradiated regions of the divided cells A to F are also equal. Thus, also if a total-transmission dial is used in place of the partial-transmission dial 1 shown in FIG. 3, the respective areas of the irradiated regions of the divided cells A to F are equal, so that highly efficient power generation can be performed.

The irradiated regions 14A and 14F defined by the first window portion are divided by a dividing line that extends in the 12-6 o' clock direction. Further, the irradiated regions 14C and 14D defined by the second window portion are divided by a dividing line that extends in the same direction. Furthermore, the irradiated regions 14B and 14C and the irradiated regions 14E and 14D defined by the second window portion are divided by two dividing lines that individually extend in the 12-6 o' clock direction and the 3-9 o' clock direction perpendicular thereto.

The other region than the irradiated regions is divided by using straight lines or curves in any other directions than the 12-6 o' clock direction and the 3-9 o' clock direction.

Hand shafts (not shown) on which the hands located in the 12-o' clock position, 3-o' clock position, 6-o' clock position, and 9-o' clock position are mounted individually are arranged penetrating shaft holes J1 to J4 in the solar cell. The shaft holes J1 to J4 are formed on the dividing lines in the 12-6 o' clock direction and the 3-9 o' clock direction (on the divided cells in the same direction or in directions perpendicular to each other) that divide the irradiated regions defined by the first and second window portions of the dial.

Thus, the dividing lines can be made obscure by dividing the irradiated regions by dividing the irradiated regions by only the dividing lines in the same direction or the dividing lines perpendicular to each other. Further, they can be made more obscure by setting their directions along the 12-6 o' clock direction and the 3-9 o' clock direction.

Figure 7:
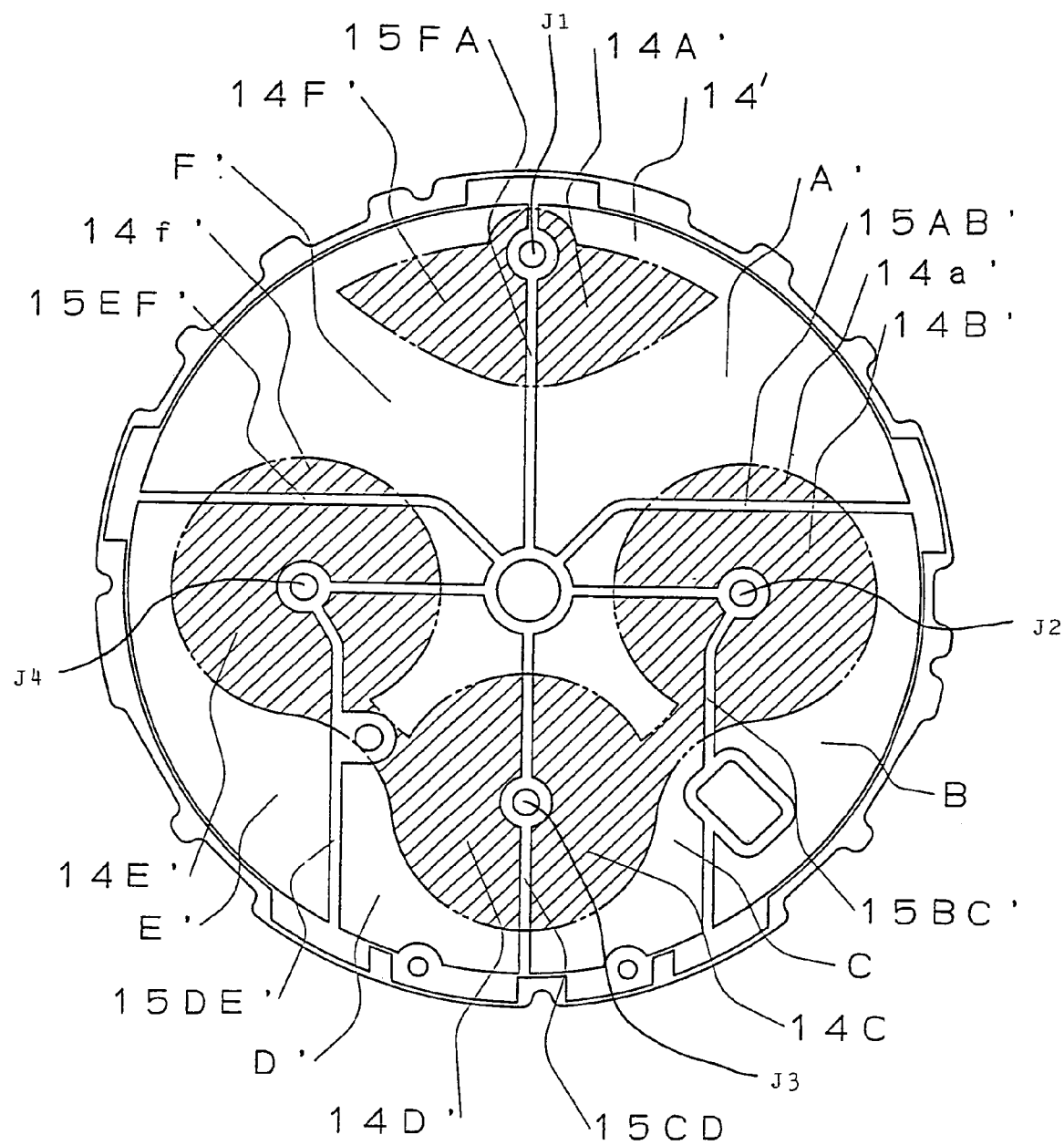
FIG. 7 is a plan view of a solar cell in an electronic device (multifunction watch) with solar cell according to a second embodiment of the present invention.

Referring to FIG. 7, there will be described a second embodiment of an electronic device (multifunction watch) with chronograph function according to the present invention. In this embodiment, the respective areas of irradiated regions of individual divided cells can be equalized even though the respective areas of first and second window portions of a dial used, unlike those of the first embodiment, are not in the integer ratio (n/m).

Figure 3:
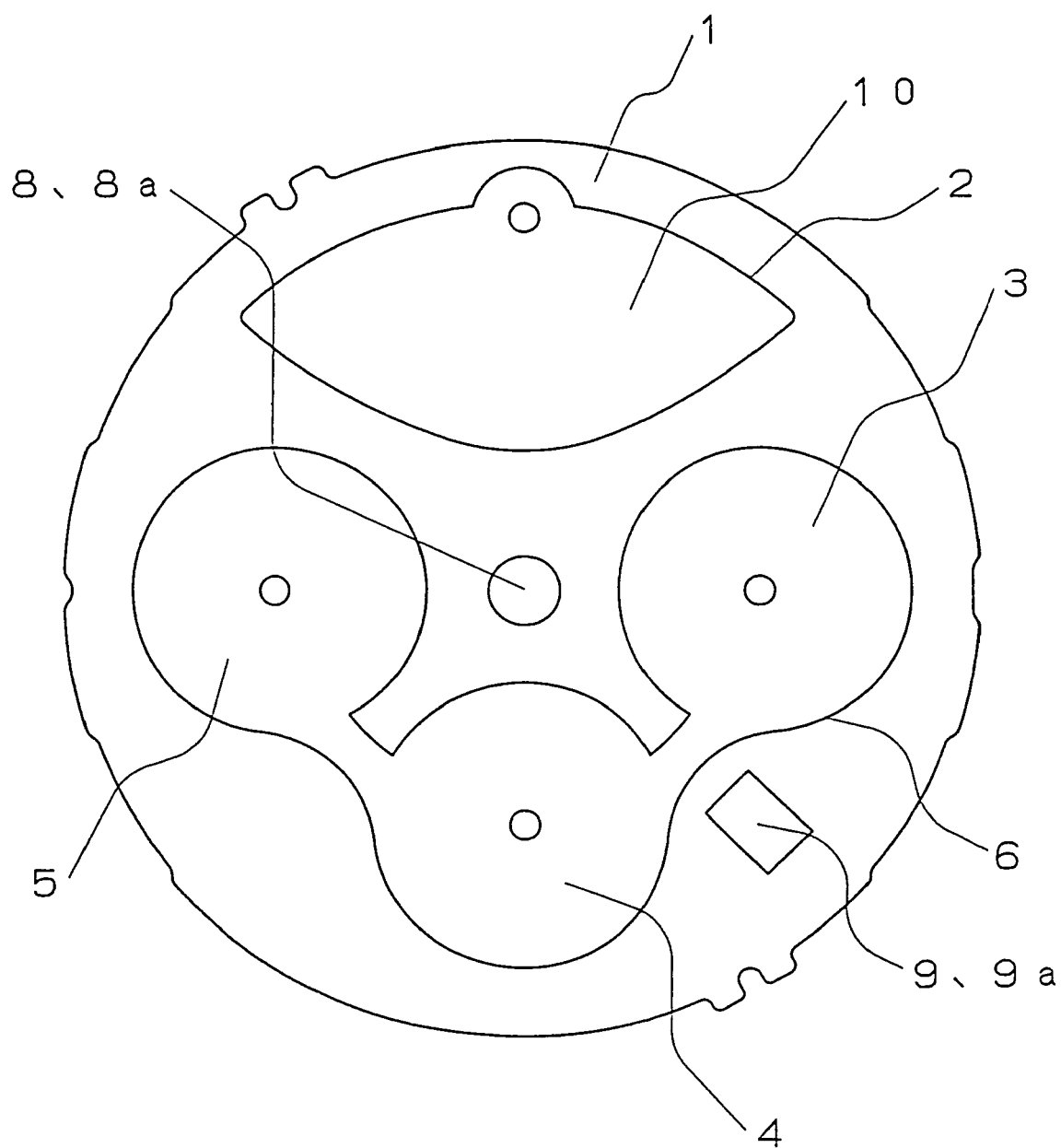
FIG. 3 is a plan view of a completed dial of the watch of FIG. 1 formed by locating a second dial on the lower surface of a first dial.
Figure 4:
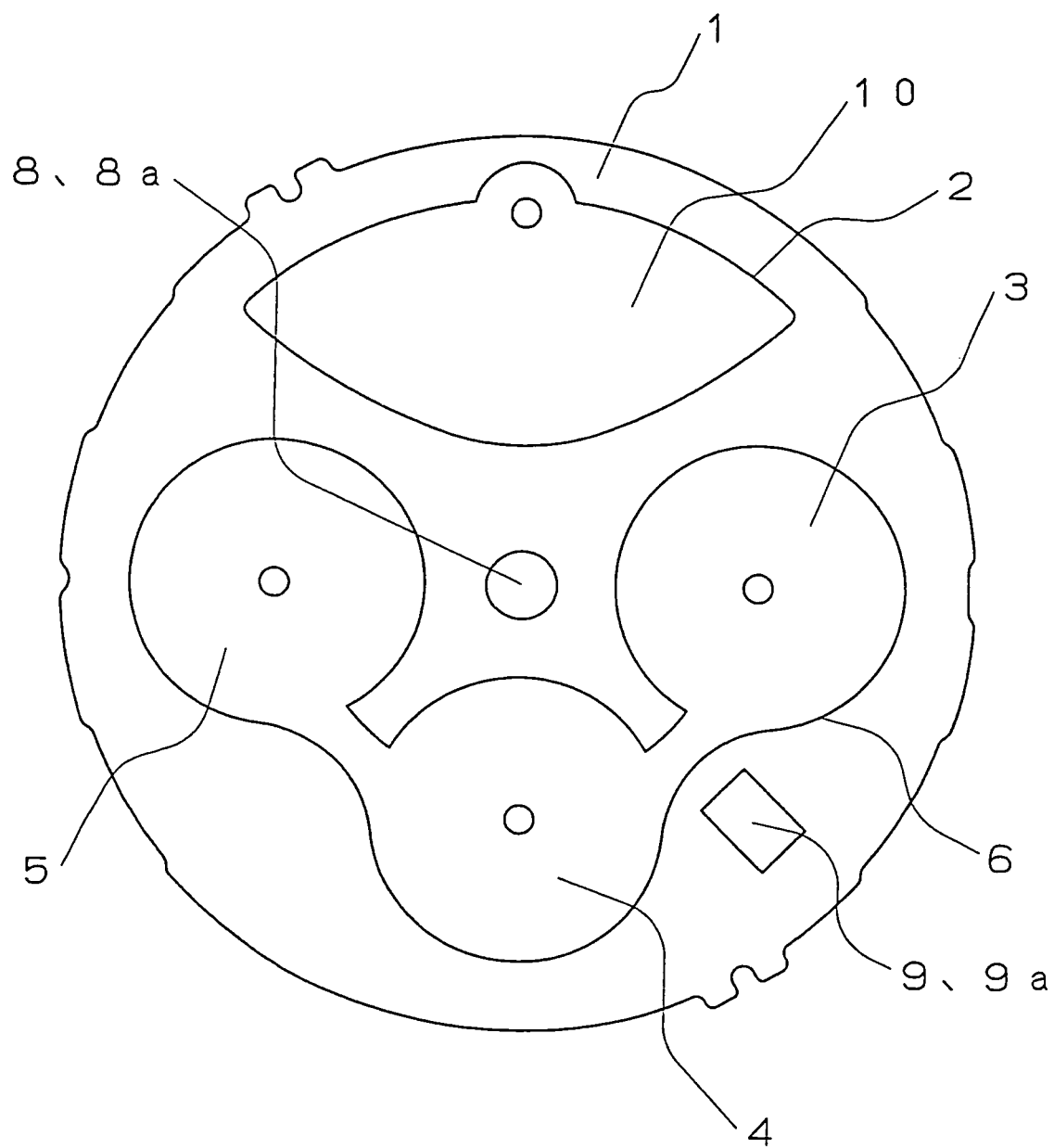
FIG. 4 is a plan view of the first dial (metallic dial) with display windows constituting the completed dial of FIG. 3.
Figure 5:
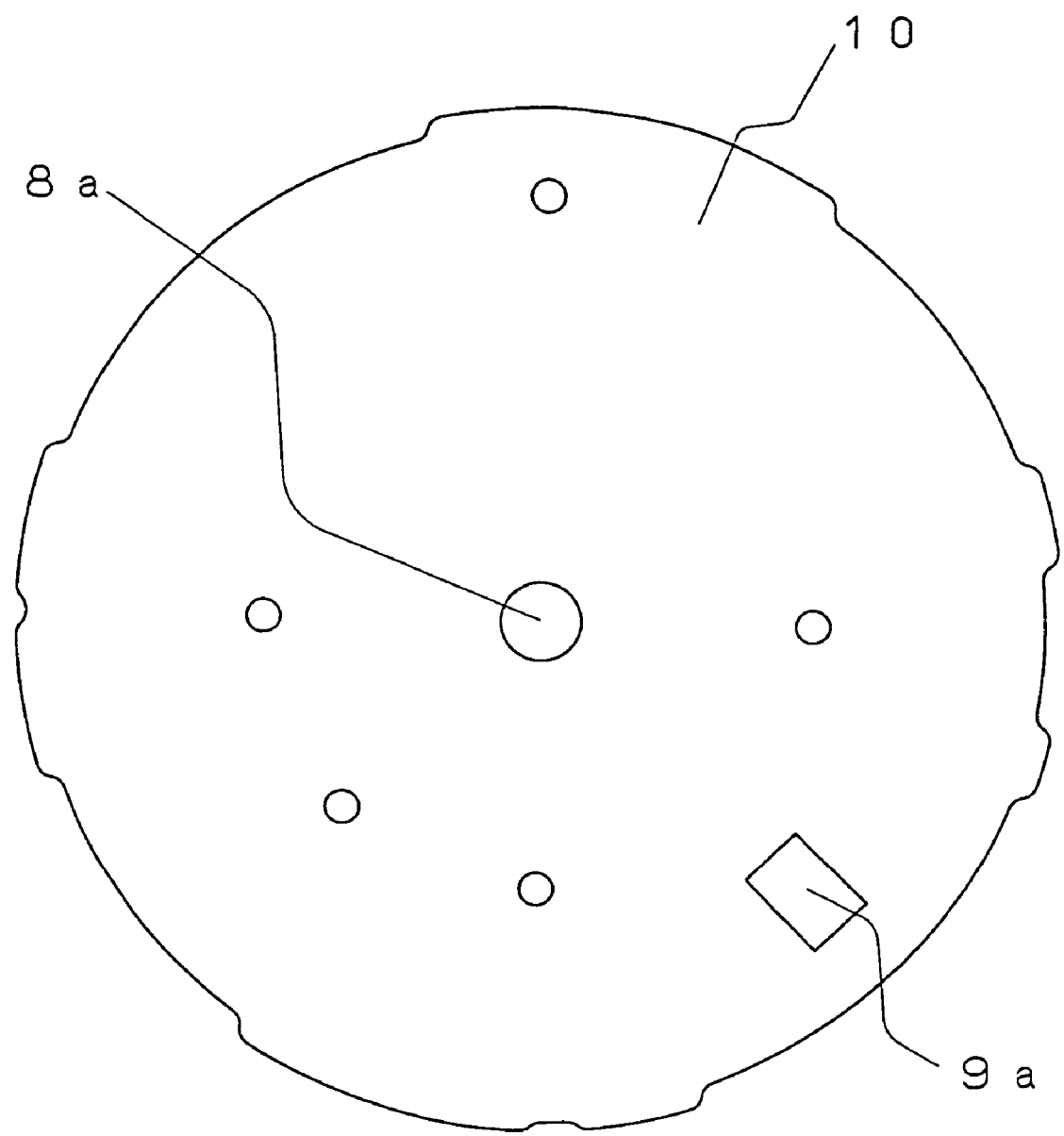
FIG. 5 is a plan view of a second dial (plastic dial) formed of a translucent member constituting the completed dial of FIG. 3.

FIG. 7 shows an example of a dial that has substantially the same shape as the first dial 1 shown in FIG. 3, but of which a first window portion 2 (not shown) has an area reduced to about half that of the dial 1. In this example, a plurality of dividing lines (15FA, 15AB', 15BC', 15CD, 15DE' and 15EF') are set on a solar cell 14 so that the respective areas of irradiated regions of divided cells A' to F' are equal in area when the dial is placed on the solar cell 14.

In the example shown in FIG. 7, an irradiated region defined by the first window portion 2 is halved by the dividing line 15FA and divided between an irradiated region 14A' of the divided cell A' and an irradiated region 14F' of the divided cell F'. Since the area of each of the irradiated regions 14A' and 14F' is smaller than an area obtained by quartering an irradiated region defined by a second window portion 6 (i.e., a sixth of the area sum of the irradiated regions defined by the first and second window portions 6), however, the respective areas of the irradiated regions of the divided cells are equalized by modifying the dividing lines 15AB, 15BC, 15DE and 15EF of FIG. 6 into dividing lines 15AB', 15BC', 15DE' and 15EF', respectively.

Specifically, parts (14a' and 14f') of the irradiated regions of the divided cells B' and E' defined by the second window portion 6 are taken on the side of the divided cells A' and F', respectively, by setting the dividing lines 15AB' and 15EF' of FIG. 7 in positions where they divide the irradiated regions defined by the second window portion 6. Further, the dividing lines 15BC' and 15DE' are set so that irradiated areas 14B' and 14E' in the divided cells B' and E', which are reduced by the taking-in, are equal to irradiated areas 14C' and 14D' in the divided cells C' and D'. Thus, irradiated regions (14A'+14a'), 14B', 14C', 14D', 14E' and (14f'+14F') of the six divided cells A', B', C', D', E' and F' are all equal in area.

Specifically, the parts 14a' and 14f' of the irradiated regions defined by the second window portion are added as additional irradiated regions into the first divided cells A' and F' in which the irradiated regions 14A' and 14F' are defined by the first window portion. By doing this, the respective irradiated areas of the first divided cells A' and F' and the second divided cells B', C', D' and E', of which the irradiated regions are formed of the remaining parts of the irradiated regions defined by the second window portion, are equalized.

If the area of the first window portion 2 (area of irradiation of the solar cell 14 through the first window portion 2) and the area of the second window portion 6 (area of irradiation of the solar cell 14 through the second window portion 6) are W1 and W2, respectively, in general, a plurality of dividing lines are set so that k number of irradiated regions with an area of (W1+W2)/k are formed, in order to divide the solar cell 14 into k number of cells.

Thus, the irradiated regions of the individual divided cells can be divided so as to be equal in area, as shown in FIG. 7, even though the condition (W1/W2=n/m) according to the first embodiment (FIG. 6) is not fulfilled by the respective areas W1 and W2 of the first window portion 2 and the second window portion 6. In a solar cell 14' shown in FIG. 7, as compared with the solar cell 14 shown in FIG. 6, however, the dividing lines 15AB' and 15EF' are further inevitably seen through the second window portion. If the area ratio between the first window portion 2 and the second window portion 6 is set to n/m for division for the dial 1, as shown in FIG. 6, therefore, the dividing lines that can be seen through the second window portion 6 are reduced in number. Even if a dial with high transmittance is used, therefore, its appearance quality cannot be damaged.

As in the first embodiment, shaft holes J1 to J4 in the solar cell are formed on dividing lines that divide the irradiated regions defined by the first window portion and the second window portion of the dial.

Figure 8:
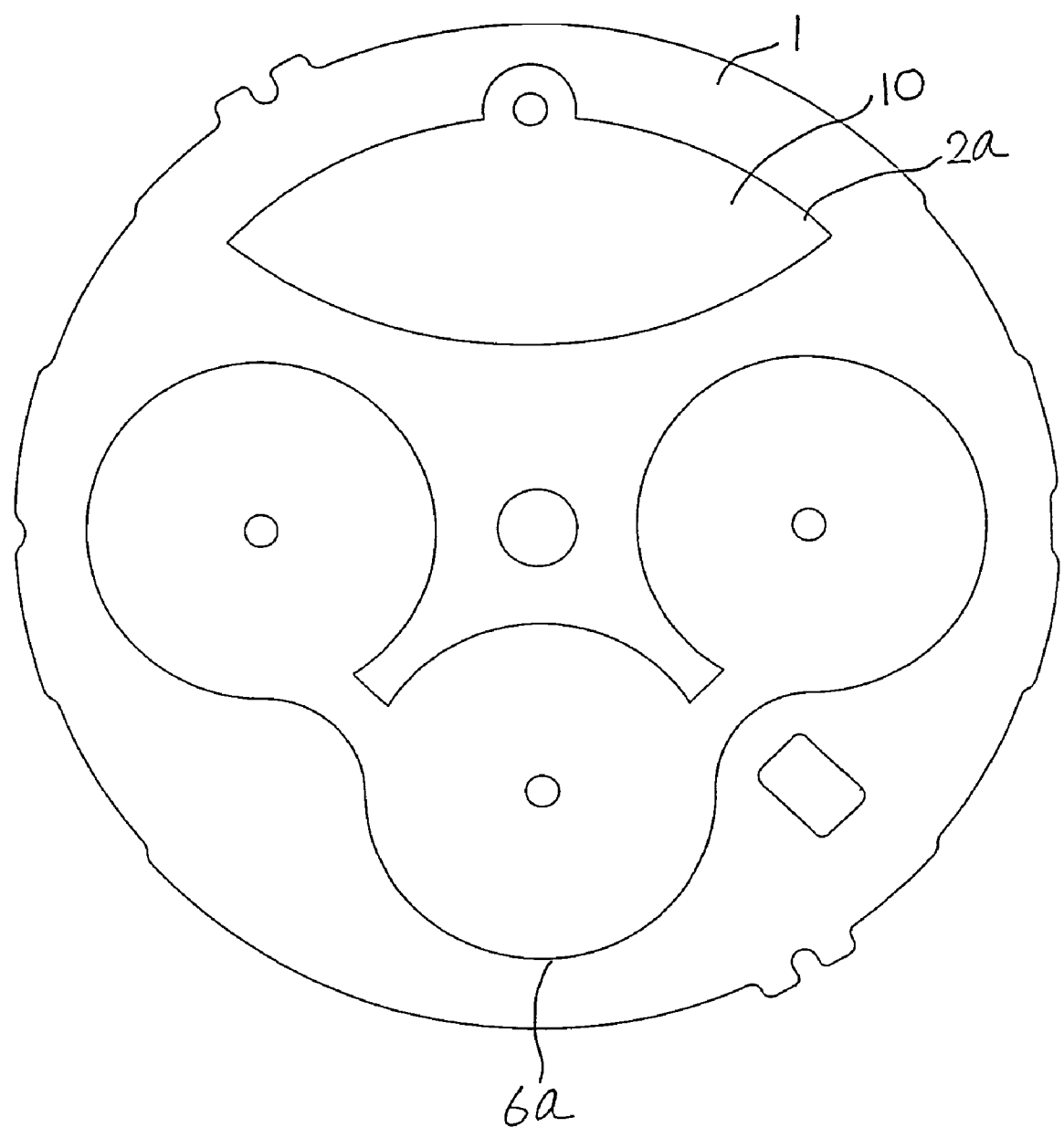
FIG. 8 is a plan view of a completed dial in an electronic device (multifunction watch) with solar cell according to a third embodiment of the present invention.
Figure 9:
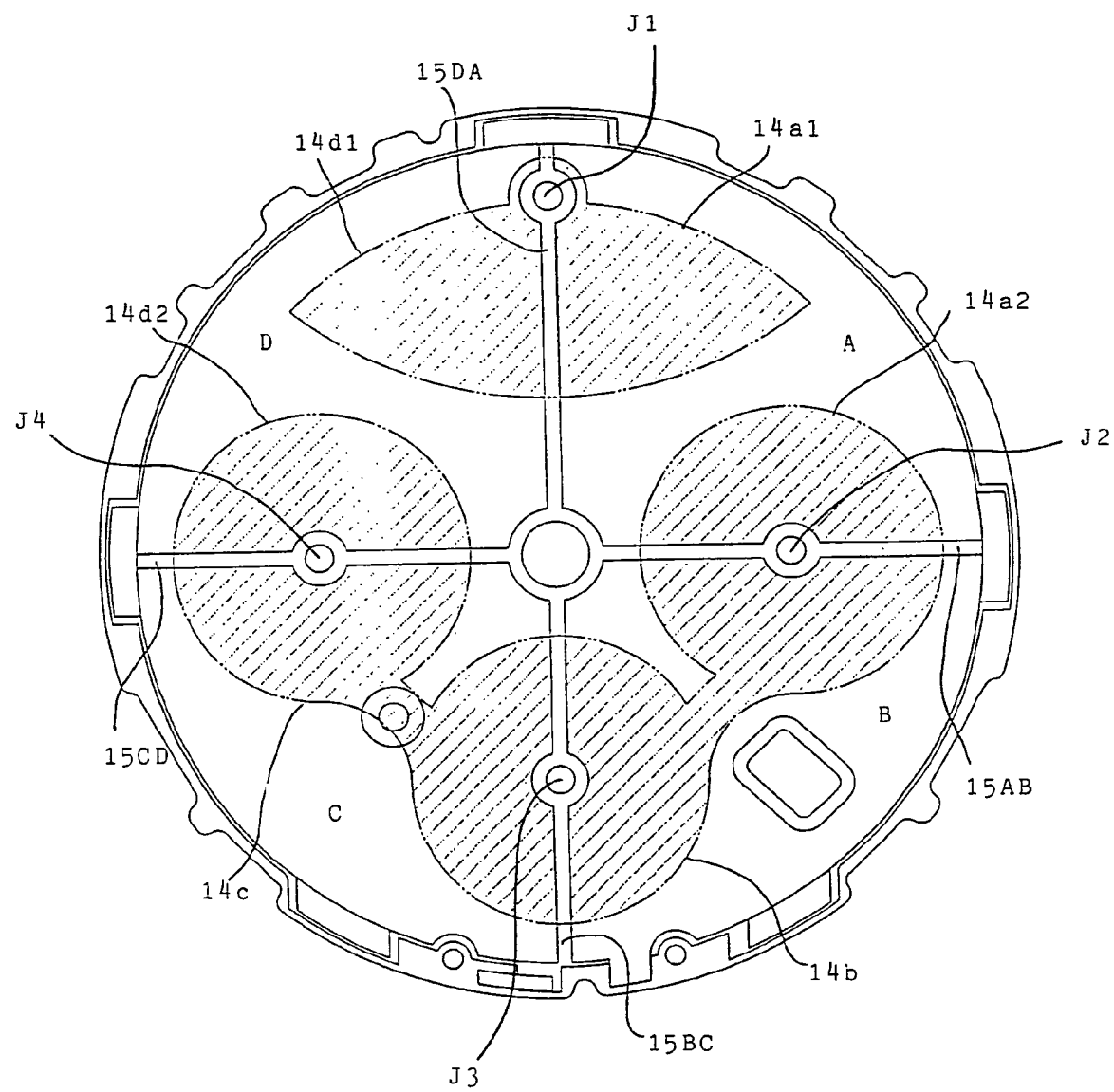
FIG. 9 is a plan view of a solar cell in the electronic device (multifunction watch) with solar cell according to the third embodiment of the present invention.

Referring to FIGS. 8 and 9, there will be described a third embodiment of an electronic device (multifunction watch) with chronograph function according to the present invention.

FIG. 8 shows a completed dial in which a first dial 1 is placed on a second dial 10. This first dial 1, substantially like the first dial 1 of the first dial 1 of the first embodiment (FIG. 4), has a first window portion 2a and a second window portion 6a (another window portion). A solar cell 14 of FIG. 9 that is combined with the first dial 1 of FIG. 8 is equally divided into four divided cells A, B, C and D by four dividing lines 15DA, 15AB, 15BC and 15CD.

The divided cell A has an irradiated region 14a1 defined by the first window portion 2a and an irradiated region 14a2 (additional irradiated region) defined by the second window portion 6a, the divided cell B has an irradiated region 14b defined by the second window portion 6a, the divided cell C has an irradiated region 14c defined by the second window portion 6a, and the divided cell D has an irradiated region 14d1 defined by the first window portion 2a and an irradiated region 14d2 (additional irradiated region) defined by the second window portion 6a. Areas (14a1+14a2), 14b, 14c, and (14d1+14d2) of the irradiated regions of the divided cells A, B, C and D are all equal.

Specifically, the parts 14a2 and 142d of the irradiated regions defined by the second window portion are added as additional irradiated regions into the first divided cells A and D in which the irradiated regions 14a1 and 14d1 are defined by the first window portion. By doing this, the respective irradiated areas of the first divided cells A and D and the second divided cells B and C, of which the irradiated regions are formed of the remaining parts of the irradiated regions defined by the second window portion, are equalized.

Although the areas of the irradiated regions of the divided cells are equal, in this embodiment, one dividing line 15DA is seen through the first window portion 2a, while three dividing lines 15AB, 15BC and 15CD are seen through the second window portion. However, the dividing lines 15DA, 15AB, 15BC and 15CD are straight lines, the dividing lines 15DA and 15BC are located on one straight line (that connects the 12-o' clock and 6-o' clock positions), and the dividing lines 15AB and 15CD are located on another straight line (that connects the 3-o' clock and 9-o' clock positions) perpendicular to the above straight line. Therefore, quartering of the solar cell 14, that is, formation of the four divided cells, is easy. Although the dividing lines are seeable through the first and second window portions 2a and 6a, moreover, they are not very conspicuous and constitute no obstacle, since they are straight lines.

As in the first embodiment, shaft holes J1 to J4 in the solar cell are formed on dividing lines that extend in the same direction or in directions perpendicular to each other and divide the irradiated regions defined by the first window portion and the second window portion of the dial.

Figure 10:
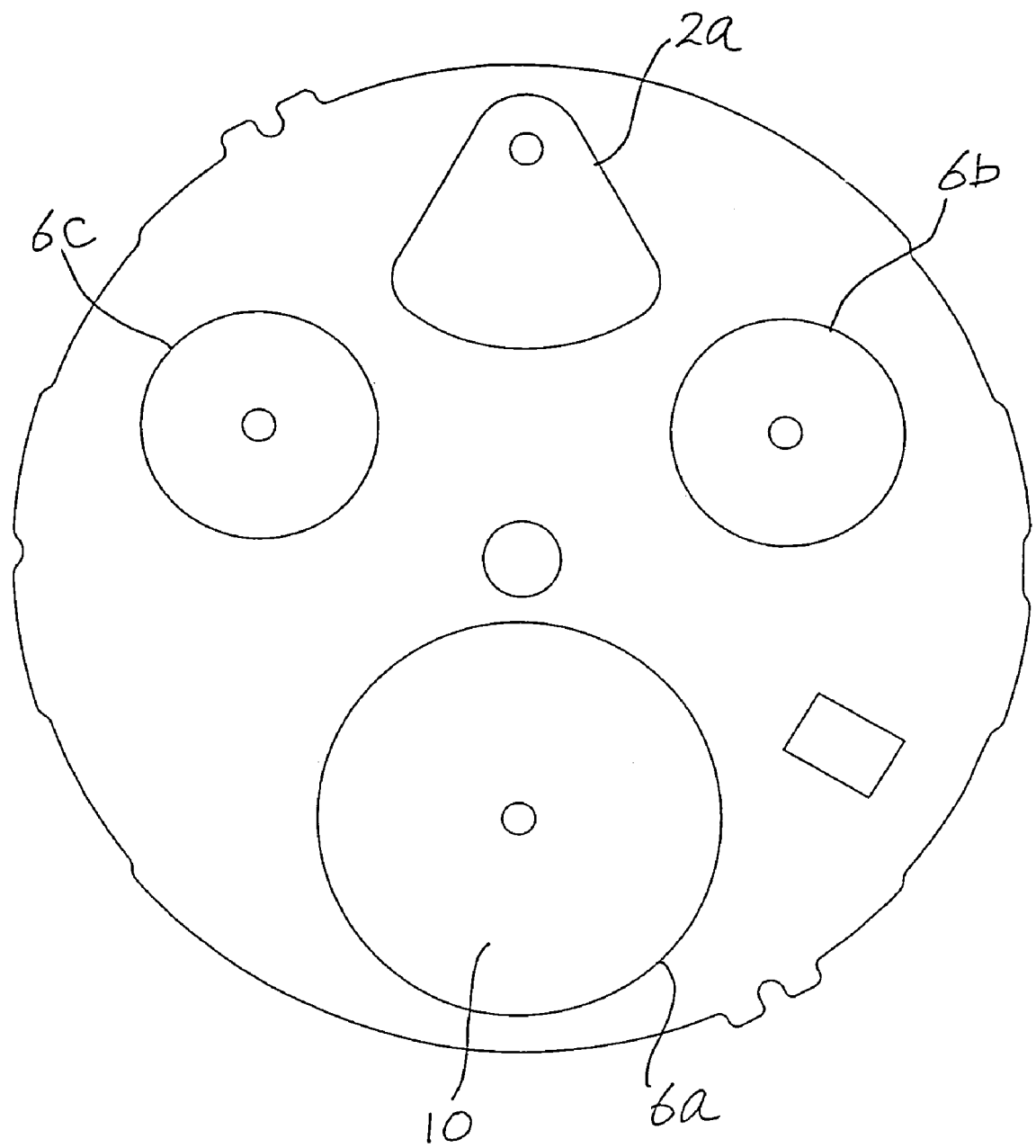
FIG. 10 is a plan view of a completed dial in an electronic device (multifunction watch) with solar cell according to a fourth embodiment of the present invention.
Figure 11:
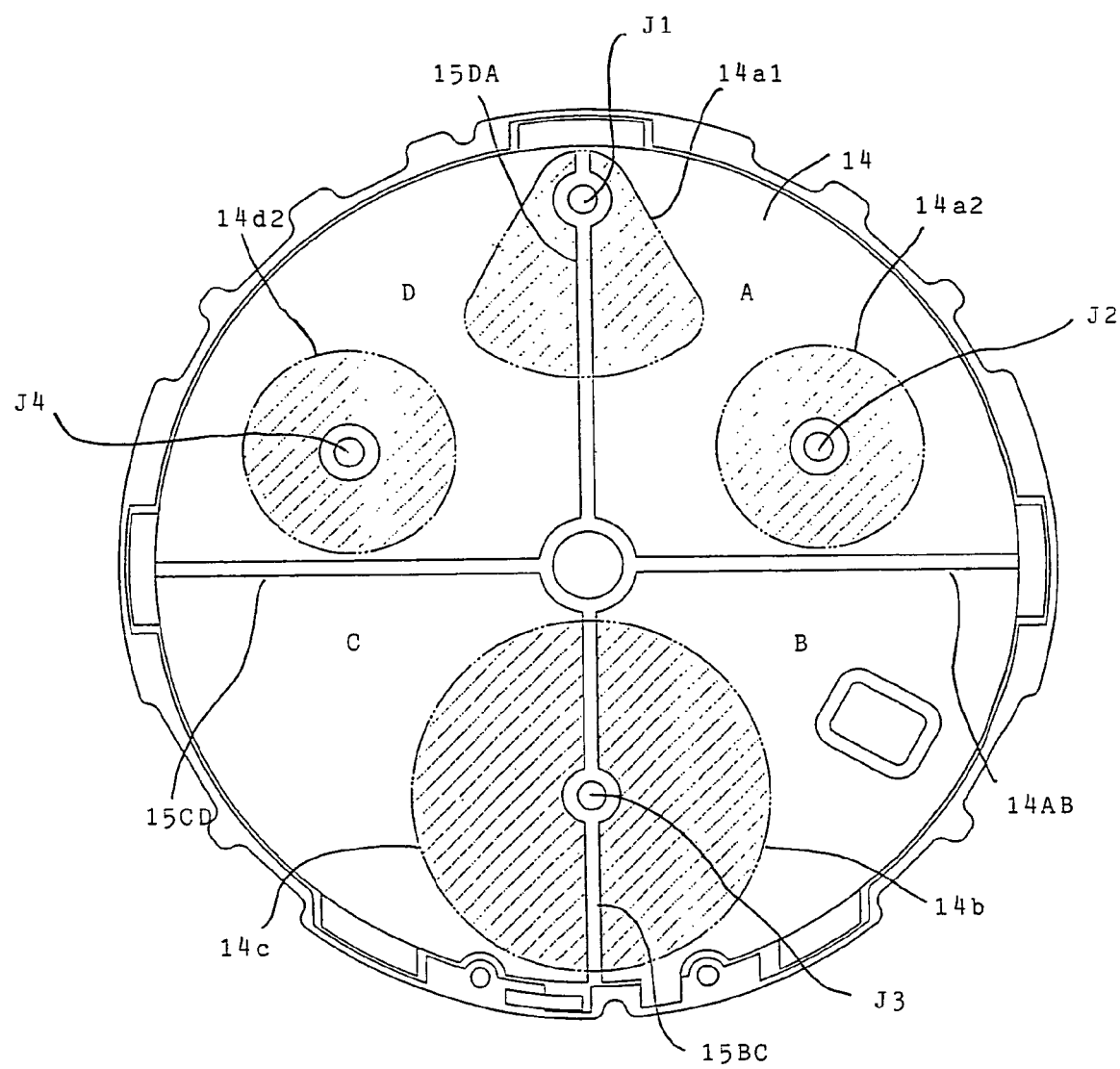
FIG. 11 is a plan view of a solar cell in the electronic device (multifunction watch) with solar cell according to the fourth embodiment of the present invention.
Figure 12:
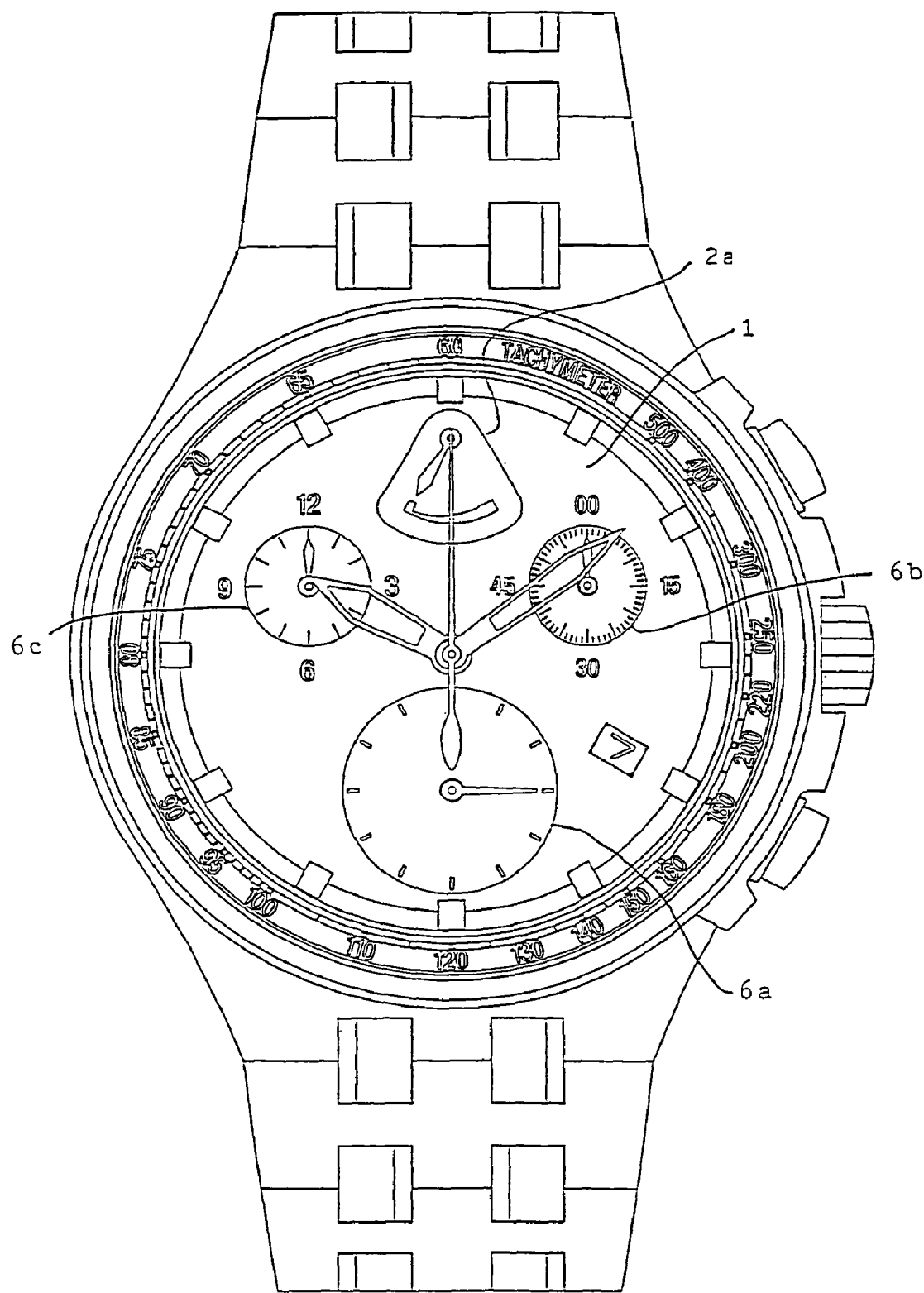
FIG. 12 is a plan view showing an external appearance of the electronic device (multifunction watch) with chronograph function using the first dial shown in FIG. 10.

Referring to FIGS. 10, 11 and 12, there will be described a fourth embodiment of an electronic device (multifunction watch) with chronograph function according to the present invention.

FIG. 10 shows a completed dial in which a first dial 1 is placed on a second dial 10. This first dial 1 has a first window portion 2a with the area W1 and three other window portions, including a second window portion 6a with the area W2, a third window portion 6b with an area W3, and a fourth window portion 6c with an area W4. Here we have W1/2+W3=W1/2+W4=W2/2.

If a solar cell 14 is divided in four by a dividing line 15DA that halves an irradiated region defined by the first window portion 2a with the area W1, a dividing line 15BC that halves an irradiated region defined by the second window portion 6a with the area W2, and two dividing lines 15AB and 15CD that divide none of irradiated regions defined by the window portions, the respective areas of irradiated regions (14a1+14a2), 14b, 14c, and (14d2+14d1)) of four divided cells A, B, C and D are all equal.

Specifically, in this embodiment, the irradiated areas of the first divided cells A and D are made equal to the irradiated areas of the second divided cells B and C of which the irradiated regions are defined by the second window portion by forming an additional irradiated region 14a2 defined by the third window portion and an additional irradiated region 14d2 defined by the fourth window portion in the first divided cells A and D of which the irradiated region 14a1 is defined by the first window portion.

If n (n: 2 or a larger integer) number of groups with the same total area can be formed by combining one or a plurality of irradiated regions defined by a plurality of window portions or equal divisions obtained by dividing the irradiated regions by an integer, in general, the respective total areas of the irradiated regions in the individual divided cells can be equalized by dividing the solar cell into n number of parts.

If the area of each window is mainly taken into consideration, according to the fourth embodiment, the solar cell is divided in the following manner.

The area of each window portion is set so that the following relation holds between the area W1 of the first window portion 2a, the area W2 of the second window portion 6a, the area W3 of the third window portion 6b, and the area W4 of the fourth window portion 6c:

$$W1+W3+W4=W2.$$

If these window portions are divided into two groups, a first group defined by the window portions (first, third, and fourth window portions) represented by the left-hand side of the above equation and second group defined by the window portion (second window portion) represented by the right-hand side, the total area of the window portions included in the first group and the total area of the window portion included in the second group are equal.

The irradiated regions defined by these window portions are divided by the dividing lines 14AB and 15CD into irradiated regions defined by the window portions on the first group side and an irradiated region defined by the window portion on the second group side. Thus, the total area (W1+W3+W4) of the irradiated regions of the solar cell situated above the dividing lines 14AB and 15CD and the total area (W2) of the irradiated region below the dividing lines are equal.

In the fourth embodiment, moreover, the irradiated regions defined by window portions on the first group side are halved by the dividing line 15DA, while the irradiated region defined by the window portion on the second group side is halved by the dividing line BC. By doing this, the irradiated regions in the individual divided cells are made equal in area.

Thus, if m (m: 2 or a larger integer) number of groups with the same total area can be formed by combining a plurality of window portions with different areas, divided cells with the same irradiated area can be easily constructed by dividing the irradiated region defined by each window portion into m number of parts corresponding to the m number of groups.

In this embodiment, the irradiated region 14a2 and the irradiated region 14d2 are not divided by any dividing line, so that no dividing lines can be seen from the outside through the window portions 6b and 6c of the first dial 1.

Since the irradiated region 14a1 and the irradiated regions 14b and 14c are divided by only the dividing lines in the 12-6 o' clock direction, moreover, the dividing lines in these irradiated regions are also obscure.

While all of shaft holes J1 to J4 are formed in the irradiated regions in this embodiment, furthermore, only the shaft holes J1 and J3 are formed on the dividing lines in the irradiated regions.

FIG. 12 shows the electronic device (multifunction watch) with chronograph function that uses the first dial 1 shown in FIG. 10. In this electronic device, the first window portion 2a of the first dial 1 is used as a charged capacity display window; the second window portion 6a as a time-of-day second display window, the third window portion 6b as a chronograph minute display window, and the fourth window portion 6c as a chronograph hour display window.

Figure 13:
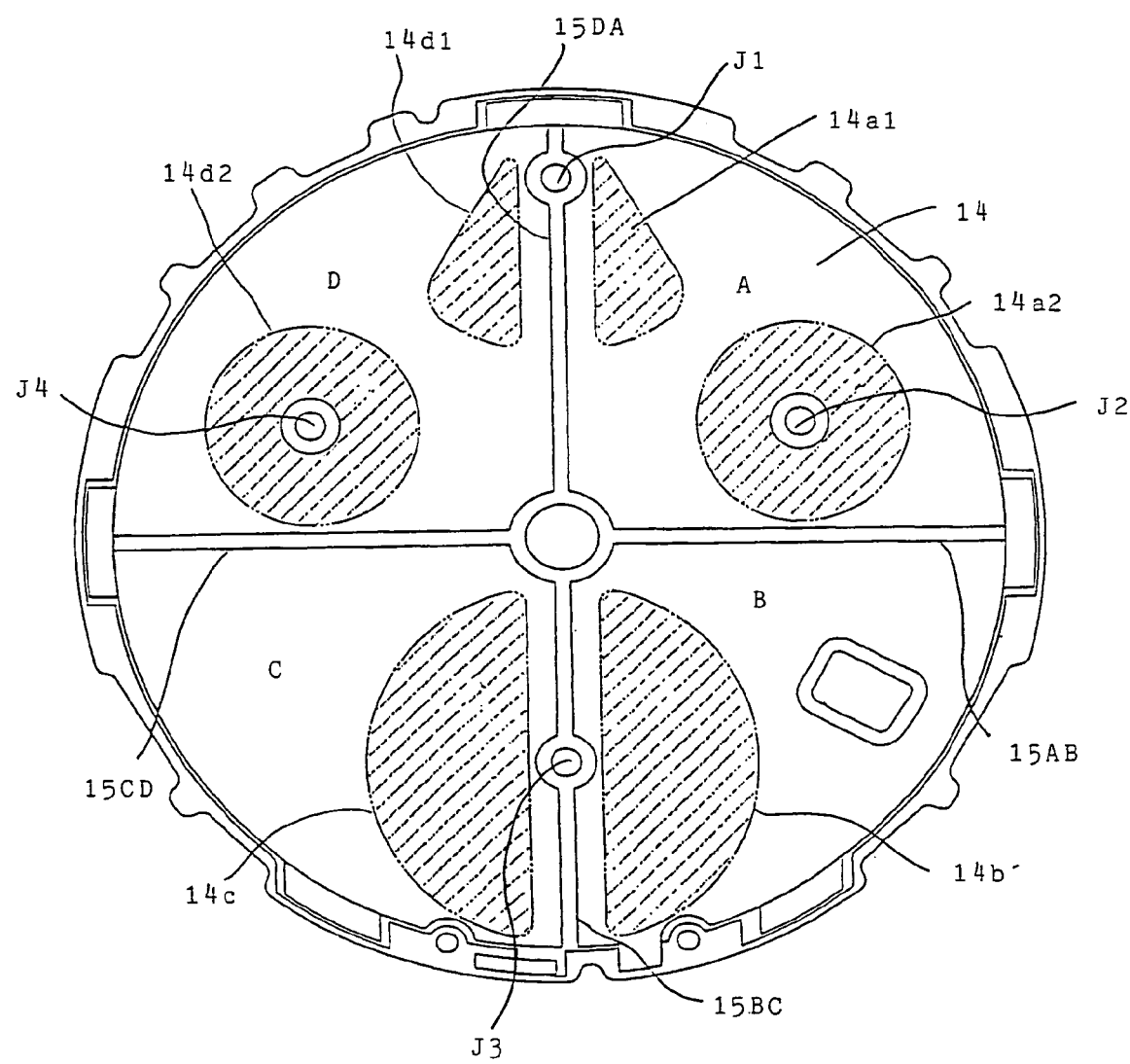
FIG. 13 is a plan view of a solar cell in an electronic device (multifunction watch) with solar cell according to a fifth embodiment of the present invention.
Figure 14:
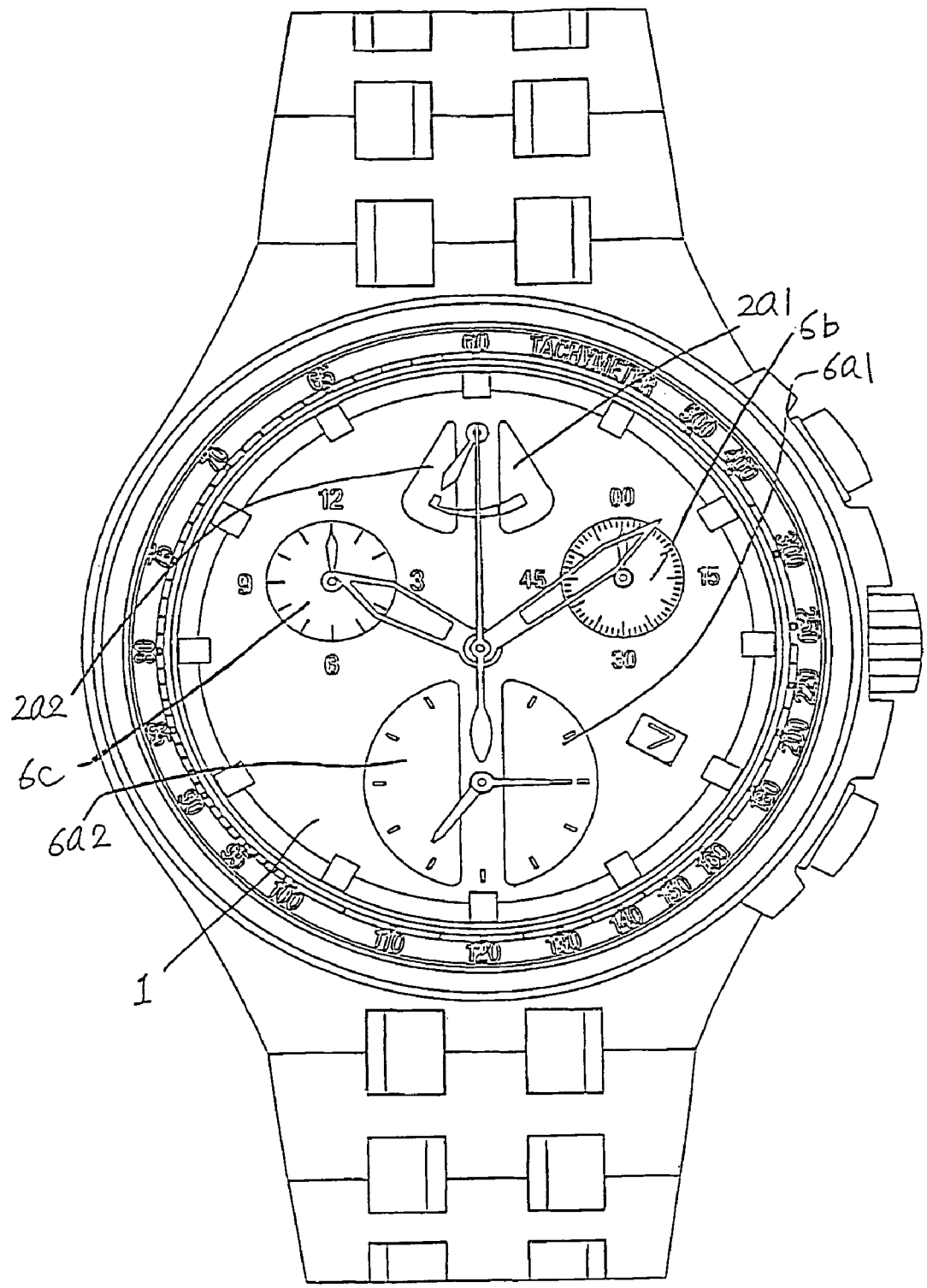
FIG. 14 is a plan view showing an external appearance of the electronic device (multifunction watch) with chronograph function using the solar cell shown in FIG. 13.
Figure 17:
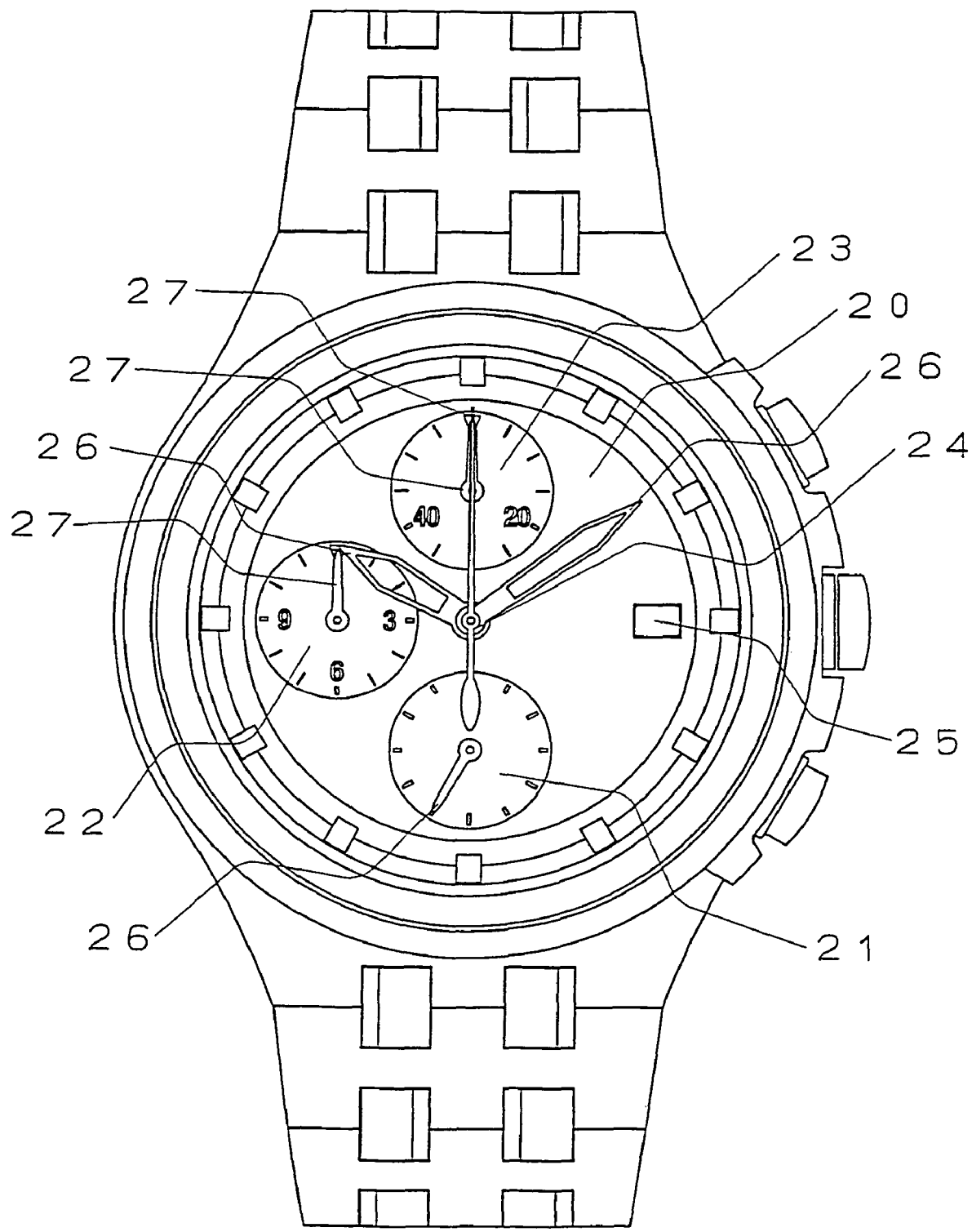
FIG. 17 is a plan view showing an external appearance of a conventional multifunction watch with chronograph function.
Figure 18:
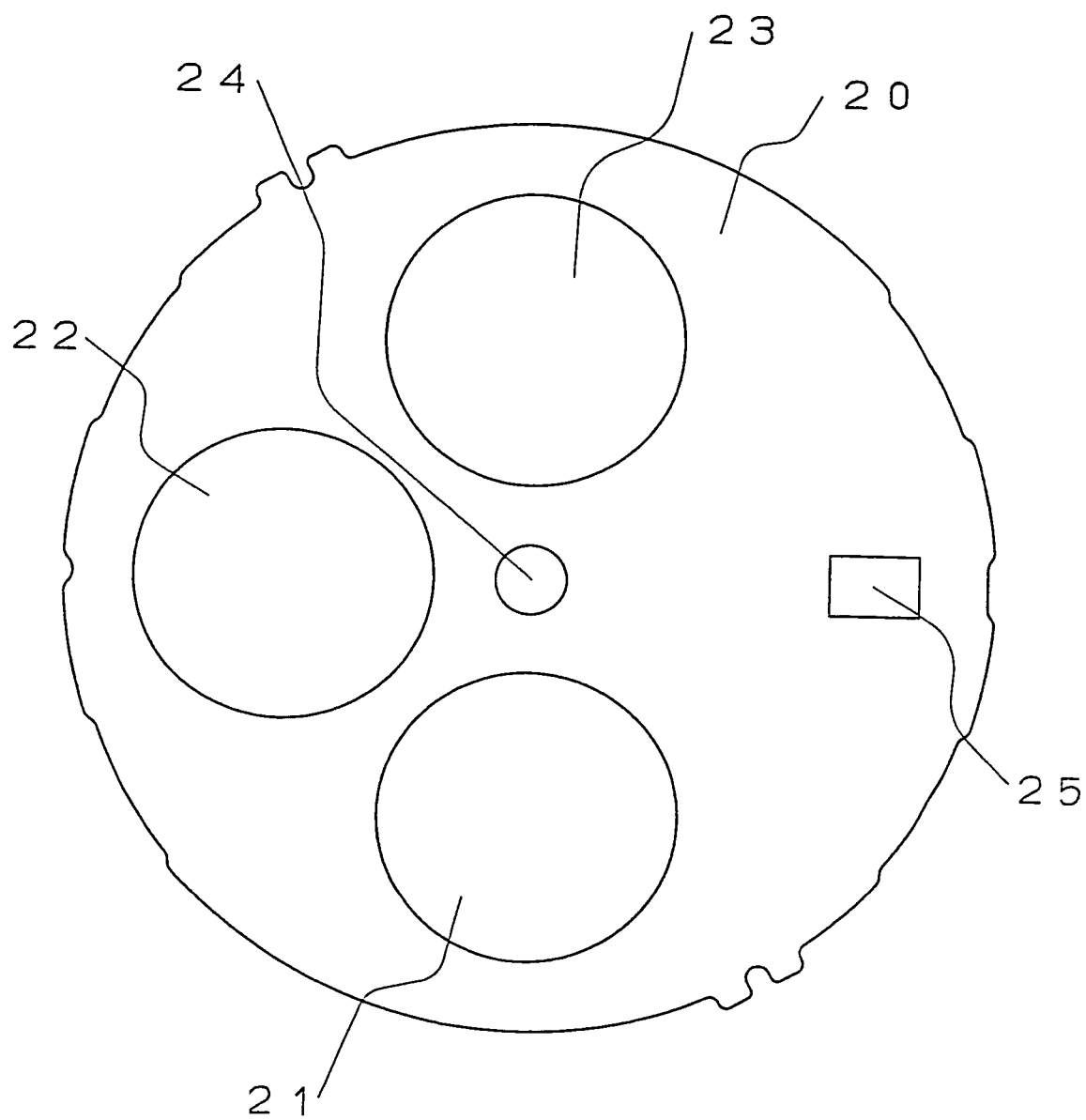
FIG. 18 is a plan view of a partial-transmission dial with display windows used in the watch of FIG. 17.
Figure 19:
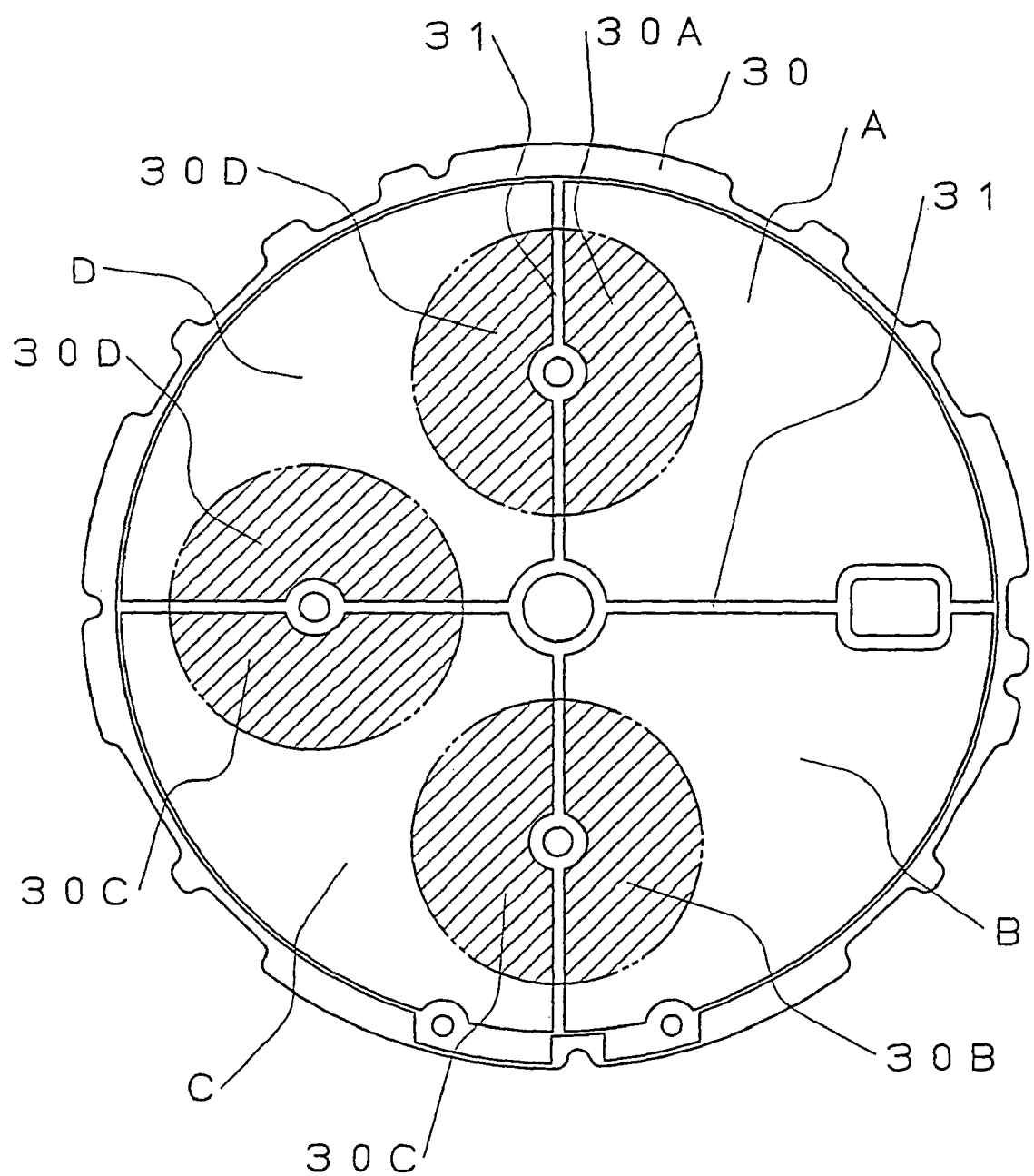
FIG. 19 is a plan view of a solar cell used in the watch of FIG. 17.

Referring to FIGS. 13 and 14, there will be described a fifth embodiment of an electronic device (multifunction watch) with chronograph function according to the present invention.

In this embodiment, the first window portion 2a (area W1) and the second window portion 6a (area W2) of the first dial 1 of the foregoing fourth embodiment (FIGS. 10 to 12) are equally divided left and right, as shown in FIG. 14, and spaced from each other by a distance greater than the width of dividing lines 15DA and 15BC, whereby the dividing lines 15DA and 15BC of a solar cell 14 are prevented from being seen through the first window portion 2a and the second window portion 6a. This embodiment shares other configurations with the fourth embodiment, so that like reference numerals are used to designate common components.

The dividing line 15DA of the solar cell 14 is situated between a window portion 2a1 with the area W1/2 and a window portion 2a2 with the area W1/2, as shown in FIG. 13, so that it can be seen through neither of these window portions. Likewise, the dividing line 15BC is situated between a window portion 6a1 with the area W2/2 and a window portion 6a2 with the area W2/2, so that it can be seen through neither of these window portions.

Also in the fifth embodiment, first to fourth window portions are divided into a first group (first, third, and fourth window portions) and a second group (second window portion) with the same total area, and irradiated regions corresponding to the first group are divided from an irradiated region corresponding to the second group by dividing lines 15AB and 15CD. Further, the individual irradiated regions are halved by dividing lines 15DA and 15BC, as in the fourth embodiment.

As described above, this embodiment is characterized in that the respective irradiated regions of the divided cells A, B, C and D are equal in area and that the dividing lines 15DA, 15AB, 15BC and 15CD of the solar cell 14 are seen through none of the window portions 2a1, 2a2, 6a1 and 6a2 formed in the first dial 1.

The following is a description of the function and effect of the watch with solar cell according to each of the embodiments described above.

The respective areas of the irradiated regions of the plurality of divided cells are substantially equalized, so that the efficiency of power generation is improved. Since the overall areas of the divided cells that are divided by the dividing lines are substantially equal, moreover, the power generation efficiency is satisfactory.

Since the translucent member (second dial) is located between the first dial and the solar cell, furthermore, the dividing lines and a plum color proper to the solar cell cannot be visually recognized with ease and never lack a sense of beauty of the device.

Although the watch with solar cell has been described in connection with the foregoing embodiments, the present invention is applicable to any electronic devices that are driven by converting optical energy supplied from the solar cell into electric energy.

The invention claimed is:

1. An electronic device with solar cell comprising a solar cell, a window member located thereon, and a load which is driven by electric power supplied from the solar cell, wherein
said solar cell has n (n: 2 or a larger integer) number of divided cells for supplying electric power to the load,
said window member has a first window portion and one or more other window portions including a second window portion having an area different from that of the first window portion, and the first and said one or more other window portions form, in said solar cell, irradiated regions that are arranged asymmetrical with respect to a horizontal line passing through the center of the solar cell, and
said first window portion and said one or more other window portions are located in said window member so that irradiated areas of the n number of divided cells are equal.

2. The electronic device with solar cell according to claim 1, wherein at least one of the first and second window portions defines an irradiated region striding over two or more adjacent divided cells, and said one or more other window portions define irradiated regions at least in all other divided cells in which no irradiated region is defined by the first window portion.

3. The electronic device with solar cell according to claim 2, wherein the area of the first window portion is set to be n1 times as large as a unit area W (n1 is an integer), the area of the second window portion is set to be n2 times as large as the unit area W (n2 is an integer different from n1), and the first window portion and the second window portion are arranged in said window member so that the irradiated region defined by the first window portion and the irradiated region defined by the second window portion are distributed with the unit area W to the individual divided cells.

4. The electronic device with solar cell according to claim 2, wherein said one or more other window portions include only the second window portion, and the number n of the divided cells is equalized to the sum of the number n1 and the number n2.

5. The electronic device with solar cell according to claim 1, wherein additional irradiated regions defined by at least one of the other window portions, in addition to the irradiated region defined by said first window portion, are formed in first divided cells.

6. The electric device according to claim 5, wherein the additional irradiated regions are defined by a third window portion and a fourth window portion provided independently of the first and second window portions.

7. The electronic device with solar cell according to claim 5, wherein the area of the first window portion is smaller than the area of the second window portion, and said additional irradiated regions are formed in a manner such that parts of the irradiated region defined by the second window portion are distributed in the first divided cells.

8. The electronic device with solar cell according to claim 7, wherein the irradiated area of the first divided cells is equalized to the irradiated area of second divided cells in which the irradiated regions are formed of remaining parts other than said parts of the irradiated region defined by the second window portion.

9. The electronic device with solar cell according to claim 5, wherein the additional irradiated regions are defined at least in part by a third window portion provided independently of the first and second window portions.

10. The electronic device with solar cell according to claim 9, wherein the irradiated area of the first divided cells is equalized to the irradiated area of second divided cells in which the irradiated regions are defined by the second window portion.

11. The electronic device with solar cell according to claim 1, wherein said one or more other window portions include one or more additional window portions other than the second window portion, the window portions formed in the window member are divided into a first group including the first window portion and a second group including the second window portion so that at least one of the window portion groups are formed of a plurality of window portions, the respective areas of the window portions are set so that a total area of the irradiated region defined by the window portions of the first group and a total area of the irradiated region defined by the window portions of the second group are equal, and the window portions are arranged so that the irradiated region defined by the window portions of the first group and the irradiated region defined by the window portions of the second group are divided forming irradiated regions of areas equal to those of the divided cells.

12. The electronic device with solar cell according to claim 1, wherein the individual divided cells are all equalized in area.

13. The electronic device with solar cell according to claim 1, wherein the individual irradiated regions defined by the first window portion and the one or more other window portions are internally divided by dividing lines extending in the same direction or at right angles to each other, and the other region than the irradiated regions is divided by using straight lines other than said individual lines extending at right angles to each other or curved dividing lines.

14. The electronic device with solar cell according to claim 1, wherein the electronic device is a watch, and the window member is a dial.

15. An electronic device with solar cell comprising a solar cell, a window member located thereon, and a load which is driven by electric power supplied from the solar cell, wherein said solar cell has a plurality of divided cells for supplying electric power to the load, said window member has at least a first window portion with an area $n1$ times as large as a unit area W ($n1$ is an integer) and a second window portion with an area $n2$ times as large as the unit area W ($n2$ is an integer different from $n1$), and said first window portion and said second window portion are arranged in the window member so that an irradiated region defined by the first window portion and an irradiated region defined by the second window portion are distributed with the unit area W to the individual divided cells.

* * * * *